(12) United States Patent
Kraut et al.

(10) Patent No.: US 7,596,185 B2
(45) Date of Patent: Sep. 29, 2009

(54) RADIO TRANSMITTER WITH VARIABLE AMPLIFIER UNITS IN THE BASEBAND SECTION AND IN THE RADIO-FREQUENCY SECTION OF THE TRANSMISSION PATH

(75) Inventors: Gunther Kraut, Egmating (DE); Ernst Josef Kristan, Dachau (DE); Günter Märzinger, Linz (AT); José Pedro Moreira Diogo Faisca, München (DE)

(73) Assignee: Infineon Technologies AG, Munich (DE)

( * ) Notice: Subject to any disclaimer, the term of this patent is extended or adjusted under 35 U.S.C. 154(b) by 631 days.

(21) Appl. No.: 11/300,244

(22) Filed: Dec. 13, 2005

(65) Prior Publication Data

US 2006/0159197 A1 Jul. 20, 2006

(30) Foreign Application Priority Data

Dec. 13, 2004 (DE) .................. 10 2004 059 985

(51) Int. Cl.
*H04L 25/49* (2006.01)
*H03C 3/00* (2006.01)
(52) U.S. Cl. ....................... 375/297; 332/100
(58) Field of Classification Search ................. 375/297, 375/296, 295; 330/100; 332/100; 455/127.3, 455/118, 522

See application file for complete search history.

(56) References Cited

U.S. PATENT DOCUMENTS

| | | | |
|---|---|---|---|
| 2001/0051511 A1* | 12/2001 | Kakizaki et al. | 455/116 |
| 2003/0206056 A1 | 11/2003 | Hietala | |
| 2004/0212445 A1* | 10/2004 | Haglan | 332/103 |
| 2005/0032489 A1* | 2/2005 | Boos | 455/127.3 |
| 2006/0057976 A1* | 3/2006 | Klemmer | 455/102 |
| 2006/0189285 A1* | 8/2006 | Takano et al. | 455/127.2 |

FOREIGN PATENT DOCUMENTS

| | | |
|---|---|---|
| DE | 101 63 466 A1 | 7/2003 |
| EP | 1 119 902 B1 | 8/2003 |

* cited by examiner

*Primary Examiner*—Khai Tran
(74) *Attorney, Agent, or Firm*—Eschweiler & Associates, LLC

(57) ABSTRACT

The invention relates to a radio transmitter for the transmission of transmission signals. Signals to be transmitted are processed to form transmission signals by the transmission path of the radio transmitter. A first variable amplifier unit and a second variable amplifier unit are arranged in the transmission path. The first variable amplifier unit is arranged in the baseband section of the transmission path, while the second variable amplifier unit is arranged in the radio-frequency section of the transmission path.

19 Claims, 3 Drawing Sheets

RADIO TRANSMITTER WITH VARIABLE AMPLIFIER UNITS IN THE BASEBAND SECTION AND IN THE RADIO-FREQUENCY SECTION OF THE TRANSMISSION PATH

REFERENCE TO RELATED APPLICATIONS

This application claims the benefit of the priority date of German application DE 10 2004 059 985.8, filed on Dec. 13, 2004, the contents of which are herein incorporated by reference in their entirety.

FIELD OF THE INVENTION

The invention relates to a radio transmitter in which the signals to be transmitted pass through a plurality of variable-gain amplifier units in the transmission path before they are sent as transmission signals by the radio transmitter.

BACKGROUND OF THE INVENTION

Most mobile radio standards specify that the output power of the mobile radio must be variable. In this case, the base station arranges the level at which the mobile radio must transmit as a function of the reception conditions.

In this way, the output level of the mobile radio can be varied between 5 dBm and 27 dBm in the low band (GSM850 and GSM900) for the GSM EDGE (GSM Enhanced Data Rate for GSM Evolution) standard, while the values for the output level in the high band (DCS1800 and PCS1900) are between 0 dBm and 26 dBm. A dynamic range of 22 dB thus results just for power adjustment in the low band and a dynamic range of 26 dB results in the high band. Future mobile radio standards such as UMTS (Universal Mobile Telecommunications System) will be subject to even more stringent requirements.

The GSM EDGE Standard uses modified 8PSK modulation as the modulation type, which allows a transmission rate which is three times higher than that of GMSK modulation. In this case, in contrast to GMSK modulation, the modulation data is subjected not only to phase modulation but also to amplitude modulation, and this necessitates a linear transmission chain. When using a linear power output stage, the output power of the mobile radio can then be controlled by varying the output amplitude of the transmitter module.

A robust transmitter structure, which is highly efficient because of large-scale digitization for the implementation, is used for so-called polar modulation. This is based on the idea that any radio-frequency signal R(t), modulated in any desired way, can be represented in the following polar coordinate form:

$$R(t) = A(t) \cdot \cos(\omega t + \phi(t)), \quad (1)$$

where A(t) denotes the amplitude information which varies over time, $\phi$(t) denotes the phase information which varies over time, $\omega$ denotes the circular frequency of the radio-frequency oscillation and t denotes the time. The payload information, such as speech or data, is contained in the amplitude A(t) and in the phase $\phi$(t).

In order to implement the polar modulation scheme at the transmitter end, the phase $\phi$(t) is transformed in the transceiver module by means of a phase locked loop to the radio-frequency level (corresponding to the cosine term in equation (1)). The amplitude information A(t) is then applied in an amplitude modulator, for example a mixer. The magnitude of the output signal from a polar modulator such as this can be varied in a suitable manner by means of an amplifier. This can be carried out on the one hand in an analogue form by a control voltage, which is applied to a VGA (Voltage Gain Amplifier) from the baseband module. On the other hand, in principle, the same functionality can be achieved by the use of an amplifier with a digitally programmable gain, a so-called PGA (Programmable Gain Amplifier), in which case the gain of a programmable amplifier is set by means of a digital control word. However, in the case of a digitally programmable amplifier, the overall architecture must be adapted such that it is ensured that the power is raised continuously from zero to the intended value at the start of a burst, while it is ensured that it is reduced in the same way at the end of the burst. This raising and reducing of the power is generally referred to in the specialist literature as "power ramping".

Both in the case of analogue and digital gain adjustment, the output voltage from the amplifier is supplied to a power output stage, which amplifies the radio-frequency signal to the desired level at the antenna.

The choice as to whether preference is given to the use of an analogue or a digital variable amplifier solution, depends on the constraints, such as the transmission standard, the technology, the drive capabilities in baseband, the transmission purity required and the power consumption. Irrespective of the choice of the amplifier, it should be remembered that the overall gain tolerance of the system in a linear chain is composed of the gain tolerances of the individual modules in the transmission path. These gain tolerances in turn depend on the temperature and frequency responses, on the operating voltage and on ageing. In order to obtain the required output power, the gain tolerances of the individual modules in the transmission path must be compensated for by means of the analogue or digital variable amplifier. This results in widening of the required dynamic adjustment range of the amplifier well beyond the range mentioned above. For example, this necessitates more than 40 dB in the high band for the GSM EDGE Standard. Furthermore, particularly for the very high output power levels, very stringent requirements are specified for the level accuracy by the 3GPP Specification and the network operators. The gain of all the components in the transmission path may therefore fluctuate only slightly in terms of the parameters mentioned above and must be reproducible, at least to the extent that it can be compensated for by software means in the baseband section of the transmission path.

In the case of previous linear GSM EDGE transmitter architectures, the amplifier can generally be varied in an analogue form, and is arranged in the radio-frequency section of the transmission path. This solution has the disadvantage of the high power consumption of the VGA module, which is required for high spectral purity of the output signal and for low noise. If CMOS (Complementary Metal Oxide Semiconductor Circuits) technology is used rather than the bipolar technology that is conventionally used for design of the amplifier in the course of changing over to modern, low-cost solutions, then this results in considerable linearity problems more particularly in downward control of the amplifier, which can be overcome, if at all, only by using large quiescent currents. Furthermore, one is confronted with the fact that the tolerances are wider than in the case of bipolar solutions, making it more difficult to trim the output power during the production of the mobile radio.

Although, as far as the Applicants are aware, this has not been achieved so far, in particular, the analogue, variable amplifier could also in principle be arranged in the baseband section of the transmission path. This would lead to a simplification of the circuit development for a linear amplifier concept and would lead to power consumption savings. One major disadvantage of a solution such as this would, however, be the occurrence of offset voltages in the amplifier and in other circuit blocks, which would result in severe carrier breakthrough but particularly when using the amplifier to reduce the wanted level. In the case of GSM EDGE, this would contravene the OOS (Origin Offset Suppression) requirement for direct modulator systems, so that, in general, the quality of the transmission signal would be reduced. In the case of polar modulator systems, breakthrough of the phase-modulated carrier would cause severe adjacent channel distortion. High-precision trimming of offset voltages such as these is possible, if at all, only with major effort.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to a radio transmitter in which the offset voltages that are caused by an amplifier arranged in the baseband section of the transmission path can be coped with more easily.

The radio transmitter according to one embodiment of the invention is used for the transmission of transmission signals. For this purpose, the radio transmitter according to the invention has a transmission path which receives signals and data to be transmitted at its input, and processes these signals and this data in such a way that the signal and data are suitable for radio transmission. The signals processed in this way are then transmitted at the output of the transmission path, as transmission signals.

Furthermore, the radio transmitter according to another embodiment of the invention comprises a first and a second amplifier unit. The gains of the two amplifier units are variable. The amplifier units are both arranged in the transmission path of the radio receiver according to the invention, and are used to amplify the signals fed to them. One aspect of the present invention is that the first variable amplifier unit is arranged in the baseband section of the transmission path, while the second variable amplifier unit is arranged in the radio-frequency section of the transmission path.

In this example, the baseband section refers to that section of the transmission path in which the signals which are processed are in baseband. In contrast, the signals in the radio-frequency section have already been converted to the carrier frequency at which the signals will in the end be transmitted from the radio transmitter.

One advantageous feature of the radio transmitter according to one embodiment of the invention is that the amplifier unit which is known from the prior art is split into amplifier units which are arranged both in the baseband section and in the radio-frequency section. This makes it possible to restrict greatly the gain range of the first variable amplifier unit in the baseband area. This measure makes it easier to cope with the offset voltages mentioned above, so that they can be reduced by offset voltage trimming to such an extent that they are insignificant to the transmission quality.

In one embodiment, a first mixer is provided in the transmission path, and converts the signals from the baseband section to radio-frequency signals. With respect to the two variable amplifier units according to the invention, this means that the first mixer is arranged between the two variable amplifier units in the transmission path.

Although the gains of the two amplifier units may be set in an analogue form, in one example the gains of the amplifier units according to the invention are digitally programmable. In consequence, the two amplifier units are in this case so-called PGAs.

The digital programming capability of the two amplifier units improves the interface to the baseband module, in which the digital programming words for gain setting are generally produced, since only digital data now need be transmitted, and this ensures a higher degree of interference immunity. In contrast to analogue gain setting, the capability to carry out digital gain setting furthermore simplifies the interface of the baseband module, since it is possible to save a digital/analogue converter that is required for analogue gain setting.

Furthermore, digitally programmable amplifier units are superior to amplifier units which can be adjusted in analogue form in terms of the reproducibility of a specific audio-frequency or radio-frequency voltage for a specific gain setting by means of a digital programming word. Furthermore, in particular, the second variable amplifier unit, which is arranged in the radio-frequency section, can be designed using CMOS technology, so that it produces comparatively little noise and distortion.

According to one example of the radio transmitter according to the invention, the radio transmitter comprises a control unit by means of which the gains of the amplifier units are adjusted. In particular, this is done by means of a digital programming word. The control unit is, in one example, integrated in the baseband module of the radio transmitter according to the invention.

In another embodiment of the radio transmitter according to the invention, a polar modulator is arranged in the transmission path. In this example, the first variable amplifier unit is connected in the amplitude path of the polar modulator.

In order to split the baseband signals into their polar coordinates, a coordinate transformer is provided in the baseband section of the transmission path, in one example. One output of the coordinate transformer feeds the amplitude path of the polar modulator, while a further output of the coordinate transformer feeds the phase path of the polar modulator.

In one example the amplitude path is fed with digital signals. These digital signals first of all pass through the first variable amplifier unit. They are then converted to analogue signals by a digital/analogue converter, which is connected in the amplitude path. A third variable amplifier unit is advantageously located downstream from the digital/analogue converter in the amplitude path, and, in this example, is digitally programmable. The described distribution of the amplifier units in the baseband area between two or more blocks results in advantages with respect to the dynamic range and the complexity of the transmission path.

In another embodiment the radio transmitter according to the invention advantageously includes a "power ramping" functionality. This functionality is achieved by a digital ramping generator feeding a second mixer which is arranged in the amplitude path, such that the second mixer can mix the amplitude signals with the signals which are obtained from the digital ramping generator. The digital ramping generator produces signals such as these in such a way that the output power of the radio transmitter according to the invention is raised at the start of a transmission burst, and the output power of the radio transmitter is reduced at the end of a transmission burst. A "power ramping" functionality is employed for operation of the radio transmitter according to the invention with digitally programmable amplifier units in the transmission path.

The amplitude modulator of the polar modulator and the second variable amplifier unit need not necessarily be in the form of separate components. These two components can advantageously be replaced by a third mixer whose gain is digitally programmable. Furthermore, a linear power output stage can also be included in the third mixer.

According to another embodiment of the radio transmitter according to the invention the second variable amplifier unit provides coarse quantization of the output power of the radio transmitter according to the invention, and the first variable amplifier unit carries out fine quantization of the output power of the radio transmitter according to the invention. This measure results in a greatly restricted gain range in the baseband section, which makes it even easier to cope with the offset voltages mentioned further above.

In order to satisfy the requirement in the GSM EDGE Standard in one embodiment, the transmission path advantageously has a linear transmission characteristic. Furthermore, a linear power output stage can be provided in the radio-frequency section of the transmission path.

The first variable amplifier unit and/or the second variable amplifier unit may be produced using CMOS technology.

The radio transmitter according to the invention may be designed for signal transmission in accordance with the GSM Standard and, in particular, in accordance with the GSM EDGE Standard.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail in the following text in an exemplary manner and with reference to the drawings, in which.

DETAILED DESCRIPTION OF THE INVENTION

Figure 1:
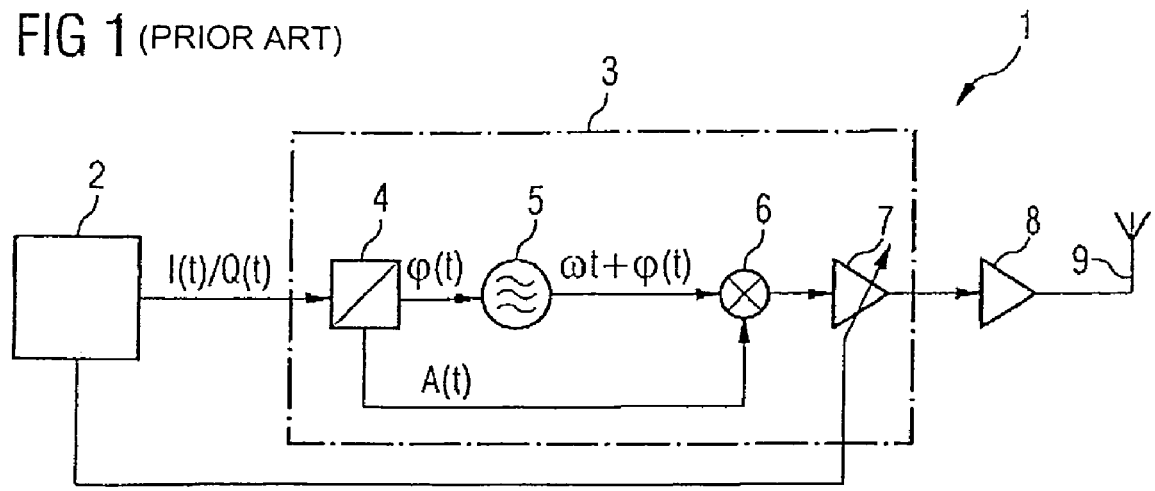
FIG. 1 is a block diagram illustrating a transmission path with a polar modulator in a mobile radio according to the prior art.

FIG. 1 shows the block diagram of the transmission path 1 of a conventional radio transmitter. A baseband module 2 and a transceiver module 3 are arranged in series in the transmission path 1. The transceiver module 3 in the present case contains a polar modulator.

The baseband module 2 produces I and Q signals, I(t) and Q(t), respectively, and passes them to a coordinate transformer 4 which is arranged in the transceiver module 3. The coordinate transformer 4 uses the signals I(t) and Q(t) to produce the polar coordinates A(t) and $\phi(t)$, where A(t) denotes the amplitude and $\phi(t)$ denotes the phase. The phase $\phi(t)$ feeds a phase locked loop (PLL) 5. The phase locked loop 5 transforms the phase $\phi(t)$ to the radio frequency range. The phase locked loop 5 accordingly emits a signal $\phi(t)+\omega t$ on the output side, in which $\omega$ denotes the circular frequency of the radio-frequency oscillation and t denotes the time. The amplitude A(t) is applied to this output signal from the phase locked loop 5 by means of a mixer 6. This results in the radio-frequency signal R(t) as described above by equation (1).

After the polar modulation, the signal that is obtained is supplied to an amplifier (VGA) 7, whose gain is adjusted in an analogue form by a control voltage. The control voltage is produced by the baseband module 2. The radio-frequency signal that has been amplified in this way is then amplified by a linear power output stage (power amplifier) 8 to the desired level, and is transmitted from an antenna 9.

Figure 2:
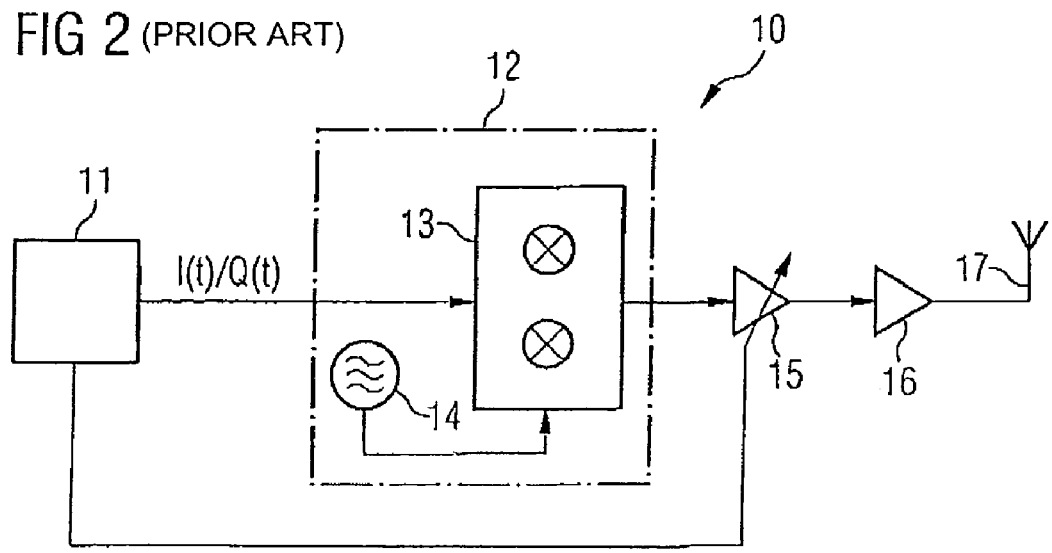
FIG. 2 is a block diagram illustrating a transmission path with a direct modulator in a mobile radio according to the prior art.

FIG. 2 shows the block diagram of the transmission path 10 of a further radio transmitter according to the prior art. In the same way as the transmission path 1 shown in FIG. 1, the transmission path 10 comprises a baseband module 11 and a transceiver module 12. The transceiver module 12 contains a direct modulator 13 instead of the polar modulator that is provided in FIG. 1. The local oscillator signal which is required for conversion of the baseband signals to the radio-frequency band is produced by a local oscillator 14. The transceiver module 10 is followed by an amplifier (VGA) 15, whose gain is adjusted in an analogue form by means of a control voltage that is produced by the baseband module 11. In precisely the same way as in FIG. 1, a linear power output stage (power amplifier) 16 and an antenna 17 are connected downstream from the amplifier 15.

The analogue variable amplifier 15 in the prior art is designed using bipolar technology. The problems which would be associated with implementation of the amplifier 15 using CMOS technology have already been discussed above. The problems which would be associated with an arrangement of the amplifier 15 in the baseband section of the transmission path 10 have likewise already been discussed above.

Figure 3:
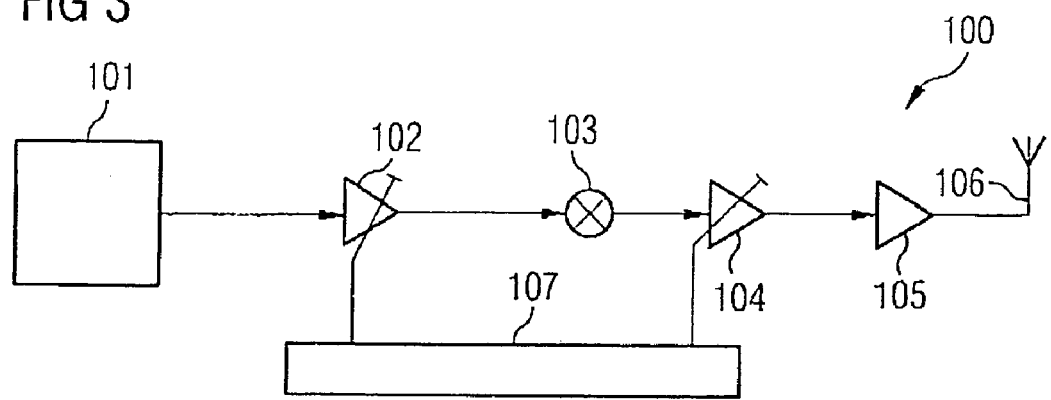
FIG. 3 is a block diagram illustrating a transmission path in a mobile radio as a first exemplary embodiment of the radio transmitter according to the invention.

FIG. 3 shows a block diagram of a transmission path 100 in a mobile radio, as a first exemplary embodiment of the radio transmitter according to the invention.

A programmable amplifier (PGA) 102 is arranged downstream from a baseband module 101 in the transmission path 100, and is likewise located in the baseband section. The programmable amplifier 102 is followed by a mixer 103, for mixing the signals to the radio-frequency range. A further programmable amplifier (PGA) 104 is located in the radio-frequency section. The signals which have been amplified by the programmable amplifier 104 also pass through a linear power output stage (power amplifier) 105 before being transmitted from an antenna 106.

The gains of the two programmable amplifiers 102 and 104 are set by means of a digital programming word 107.

Figure 4:
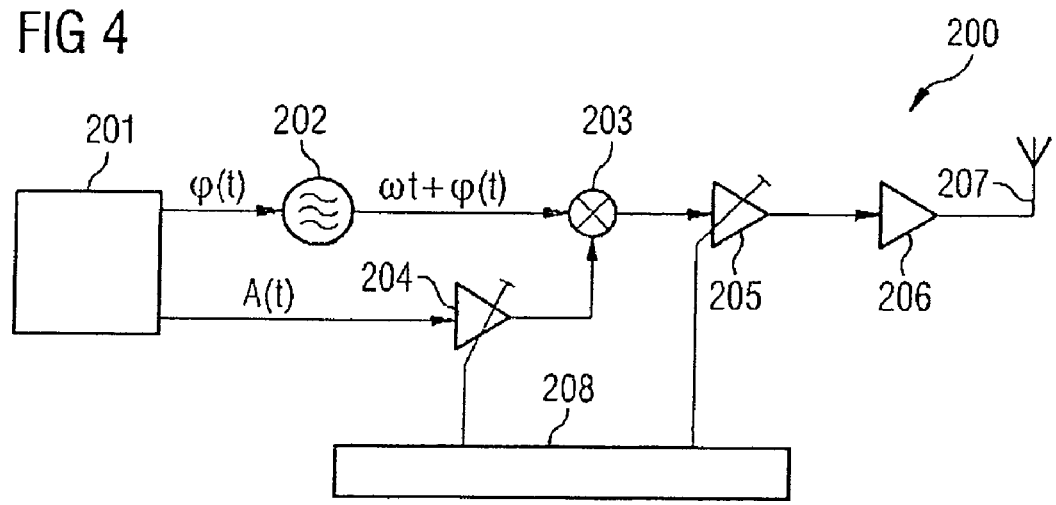
FIG. 4 is a block diagram illustrating a transmission path in a mobile radio as a second exemplary embodiment of the radio transmitter according to the invention.

FIG. 4 shows the block diagram of a transmission path 200 which, in contrast to the transmission path 100 shown in FIG. 3, has a polar modulator. The transmission path 200 that is shown in FIG. 4 serves as a second exemplary embodiment of the radio transmitter according to the invention.

The polar modulator in the transmission path 200 corresponds largely to the conventional polar modulator shown in FIG. 1. A baseband module 201 emits signals in polar coordinates, that is to say amplitude signals A(t) and phase signals φ(t) are emitted. The phase φ(t) feeds a phase locked loop 202. The phase locked loop 202 transforms the phase φ(t) to the radio-frequency range, and produces a signal φ(t)+ωt, where ω denotes the circular frequency of the radio-frequency oscillation, and t denotes the time. In contrast to conventional polar modulators, the amplitude A(t) is amplified by a programmable amplifier (PGA) 204 before being applied by means of the mixer 203, which is in the form of an amplitude modulator, to the output signal from the phase locked loop 202. In the present, second exemplary embodiment of the radio transmitter according to the invention, the variable signal gain on the baseband side is in consequence carried out in the amplitude path of the polar modulator.

The output signals from the mixer 203 pass through a further programmable amplifier (PGA) 205 and a linear power output stage (power amplifier) 206, in precisely the same way as in FIG. 3. The transmission signals that have been obtained in this way are then transmitted from an antenna 207.

The gains of the two programmable amplifiers 204 and 205 are set by means of a digital programming word 208.

Figure 5:
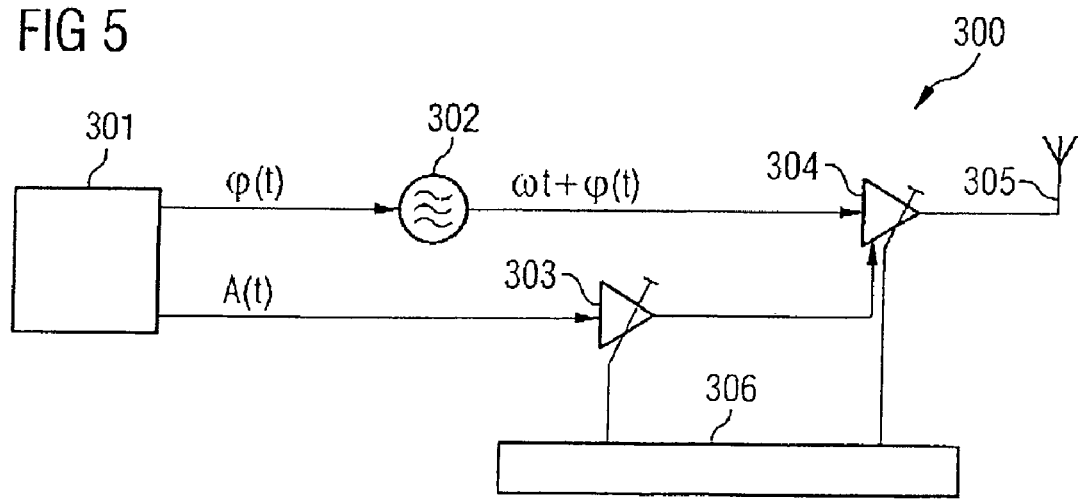
FIG. 5 is a block diagram illustrating a transmission path in a mobile radio as a third exemplary embodiment of the radio transmitter according to the invention.

FIG. 5 shows a modification of the transmission path 200 as shown in FIG. 4. The transmission path 300 which is shown in FIG. 5 serves as a third exemplary embodiment of the radio transmitter according to the invention. With a baseband module 301, a phase locked loop 302 and a programmable amplifier (PGA) 303, arranged in the amplitude path of the polar modulator, the transmission path 300 to this extent corresponds to the transmission path 200. However, in the case of the transmission path 300, the mixer, the programmable amplifier (PGA) which is arranged in the radio-frequency section and the linear power output stage (power amplifier) have been replaced by a single module 304, which has all of the functionalities of the three modules that have been mentioned. In consequence, the module 304 represents a mixer with a digitally programmable gain and a linear power output stage. In precisely the same way as in FIG. 4, the gains of the programmable amplifier 303 and of the module 304 are set by means of a digital programming word 306.

Figure 6:
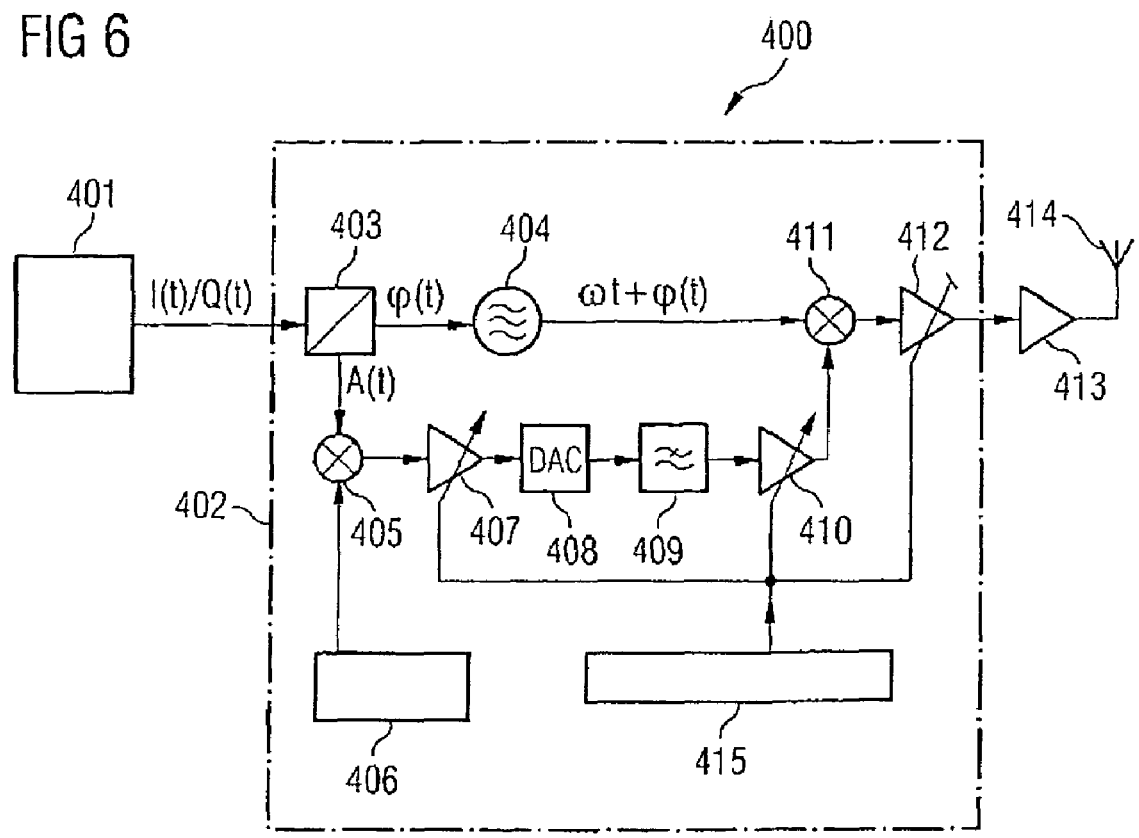
FIG. 6 is a block diagram illustrating a transmission path in a mobile radio as a fourth exemplary embodiment of the radio transmitter according to the invention.

A further modification of the transmission path 200 as shown in FIG. 4 is illustrated in FIG. 6, as a fourth exemplary embodiment of the radio transmitter according to the invention. A baseband module 401 and a transceiver module 402 are arranged in series in the transmission path 400 illustrated in FIG. 6.

The baseband module 401 produces I and Q signals I(t) and Q(t) respectively, which are passed to a coordinate transformer 403 which forms the input of the transceiver module 402. The coordinate transformer 403 uses the signals I(t) and Q(t) as polar coordinates to produce the amplitude A(t) and the phase φ(t). The phase φ(t) is fed to a phase locked loop 404 for transformation to the radio-frequency range.

The amplitude A(t) which is emitted from the coordinate transformer 403 is first of all mixed in the amplitude path of the polar modulator by means of a mixer 405 with signals which have been produced by a digital ramping generator 406. This measure allows the output power of the mobile radio to be raised continuously from zero to the intended value at the start of a burst, and to be reduced again at the end of the burst.

The mixer 405 is followed by a programmable amplifier (PGA) 407 which is also located in the digital section of the amplitude path. A digital/analogue converter 408, which is followed by a filter 409, is used to convert the digital amplitude signals to analogue amplitude signals. The filter 409 is followed by a further programmable amplifier (PGA) 410, which is in consequence located in the analogue section of the amplitude path.

The amplitude signal which is emitted from the programmable amplifier 410 is applied to the output signal from the phase locked loop 404 by means of a mixer 411 which is in the form of an amplitude modulator. The signals which are obtained in this way are supplied successively to a programmable amplifier (PGA) 412 and to a linear power output stage (power amplifier) 413, and are then transmitted from an antenna 414.

The gain settings of the programmable amplifiers 407, 410 and 412 are produced by means of a digital programming word 415.

The functions of the programmable amplifiers 407, 410 and 412 will be explained in the following text.

The programmable amplifier 412 which is arranged in the radio-frequency section of the transmission path 400, ensures the coarse quantization of the output power range of 42 dB in steps of 6 dB in each case. Of the programmable amplifiers 407 and 410 which are located in the baseband section, the programmable amplifier 410 which is arranged in the analogue section of the amplitude path carries out fine quantization in steps of 1 dB in each case, while the programmable amplifier 407 which is arranged in the digital section of the amplitude path is responsible for the final resolution of ⅛ dB.

The programmable amplifiers 407 and 410 which are located in the baseband section are also responsible for compensation for the unavoidable gain tolerances in the individual steps of the programmable amplifier 412 which is arranged in the radio-frequency section. For example, each step of the programmable amplifier 412 may fluctuate by ±1 dB for example and this has to be compensated for by the two programmable amplifiers 407 and 410 in the baseband section.

Since the programmable amplifier 410 operates in the audio-frequency range, small tolerances of less than ±0.5 dB are possible without any major problems and, in the end, these govern the overall tolerance of the output power of the mobile radio. Accuracy such as this is required in particular for high output power levels by the 3GPP Specification and the network operators.

The use of a greatly restricted gain range in the baseband section of the transmission path 400 means that the offset voltages mentioned above can also be coped with and can be reduced by offset voltage trimming to such an extent that they are insignificant to the transmission quality.

A further advantage of the present exemplary embodiment relates to the trimming of the output power, as must be carried out during production of the mobile radio. This is because the invention means that only the output power for each step of the programmable amplifier 412 that is arranged in the radio-frequency section need be measured. Any desired output power can then be set, at least to the accuracy of the programmable amplifier 410, that is to say, for example to ±0.5 dB. In comparison to the successive approximation algorithms which would otherwise be required when using programmable amplifiers, a procedure such as this involves less effort.

In the case of the exemplary embodiments of the radio transmitter according to the invention which have been explained above and are illustrated in FIGS. 3 to 6, the digital programming words for setting the gains of the programmable amplifiers are produced by a control unit which is not illustrated in FIGS. 3 to 6. By way of example, this control unit may be located in the respective baseband module.

Furthermore, the description relating to FIGS. 3 to 6 has always referred to transmission paths 100, 200, 300 and 400. This should be understood as meaning that the respective radio transmitter is associated with the respective transmission paths. This is justified to the extent that the present invention relates primarily to the components in the transmission path of the associated radio transmitter.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising". In addition, the term "exemplary" as utilized herein merely means an example, rather than the best.

The invention claimed is:

1. A radio transmitter for the transmission of transmission signals, comprising:
   a transmission path configured to process signals to be transmitted to form transmission signals;
   a first variable amplifier unit arranged in a baseband section of the transmission path;
   a second variable amplifier unit arranged in a radio-frequency section of the transmission path; and
   a polar modulator arranged in the transmission oath and configured to output an amplitude signal upstream of the first variable amplifier unit, wherein the first variable amplifier unit amplifies the amplitude signal.

2. The radio transmitter of claim 1, further comprising a first mixer arranged in the transmission path and configured to mix signals from the first variable amplifier unit in the baseband section to the radio-frequency range.

3. The radio transmitter of claim 1, wherein a gain of the first variable amplifier unit or a gain of the second variable amplifier unit is programmed digitally.

4. The radio transmitter of claim 1, further comprising a control unit configured to program the gains of the first and second variable amplifier units with a digital programming word.

5. The radio transmitter of claim 1, further comprising a coordinate transformer arranged in the baseband section of the transmission path, and configured to split the signals input thereto into their polar coordinates, with one output of the coordinate transformer providing the amplitude signal in an amplitude path of the polar modulator, and a further output of the coordinate transformer providing a phase signal in a phase path of the polar modulator.

6. The radio transmitter of claim 5, further comprising:
   a digital/analogue converter arranged in the amplitude path of the polar modulator downstream of the first variable amplifier unit; and
   a third variable amplifier unit arranged in the amplitude path downstream from the digital/analogue converter, and configured to be programmed digitally.

7. The radio transmitter of claim 1, further comprising a second mixer arranged upstream of the first variable amplifier unit in the amplitude path of the polar modulator, and configured to mix signals input thereto with signals produced by a digital ramping generator, wherein the digital ramping generator is configured to raise an output power of the radio transmitter at the start of a transmission burst, and lower the output power of the radio transmitter at the end of a transmission burst.

8. The radio transmitter of claim 7, wherein the polar modulator further comprises an amplitude modulator component, wherein the amplitude modulator component and the second variable amplifier unit together comprise a third mixer with a digitally programmable gain.

9. The radio transmitter of claim 1, wherein the second variable amplifier unit provides coarse quantization of an output power of the radio transmitter and the first variable amplifier unit carries out fine quantization of the output power of the radio transmitter.

10. The radio transmitter of claim 1, further comprising a linear output stage arranged in the radio-frequency section of the transmission path, wherein the transmission path has a linear transmission characteristic.

11. The radio transmitter of claim 1, wherein the radio transmitter is configured to provide signal transmission in accordance with the GSM EDGE Standard.

12. A radio transmitter system, comprising:
   a baseband module configured to generate quadrature signal components associated with payload data to be transmitted;
   a transceiver module operably coupled to the baseband module, and configured to transform the quadrature signal components to amplitude and phase signal components in respective amplitude and phase signal paths, wherein the amplitude signal path comprises first and second variable digitally programmable amplifier units.

13. The radio transmitter system of claim 12, further comprising a control unit configured to generate a digital programming word and transmit the digital programming word to the first and second variable digitally programmable amplifier units.

14. The radio transmitter system of claim 12, further comprising:
   an amplitude path mixer; and
   a digital ramping generator configured to generate a digital ramping signal,
   wherein the amplitude path mixer is configured to mix the amplitude signal component and the digital ramping signal, thereby raising an output power of the transmitter at a start of a transmission burst and lowering the output power at an end of the transmission burst.

15. The radio transmitter system of claim 14, further comprising a phase locked loop in the phase signal path configured to receive the phase signal component and transform such signal to a radio-frequency phase signal.

16. The radio transmitter system of claim 15, further comprising a path mixer configured to mix the radio-frequency phase signal and the amplitude signal amplified by the first and second variable digitally programmable amplifier units.

17. The radio transmitter system of claim 16, further comprising a third variable digitally programmable amplifier unit downstream of the path mixer.

18. The radio transmitter system of claim 12, further comprising a polar modulator arranged in the transmission path and configured to output an amplitude signal upstream of the first variable digitally programmable amplifier unit, wherein the first variable digitally programmable amplifier unit amplifies the amplitude signal.

19. A radio transmitter for the transmission of transmission signals, comprising:

a transmission path configured to process signals to be transmitted to form transmission signals;

a polar modulator arranged in the transmission path and a digital/analogue converter arranged in an amplitude path of the polar modulator;

a first digitally programmable amplifier unit arranged in the amplitude path upstream of the digital/analogue converter;

a second digitally programmable amplifier unit arranged in the amplitude path downstream of the digital/analogue converter; and a third digitally programmable amplifier unit arranged in a radio frequency section of the transmission path.

\* \* \* \* \*

UNITED STATES PATENT AND TRADEMARK OFFICE
CERTIFICATE OF CORRECTION

| | | |
|---|---|---|
| PATENT NO. | : 7,596,185 B2 | Page 1 of 1 |
| APPLICATION NO. | : 11/300244 | |
| DATED | : September 29, 2009 | |
| INVENTOR(S) | : Gunther Kraut et al. | |

It is certified that error appears in the above-identified patent and that said Letters Patent is hereby corrected as shown below:

Column 9, claim 1, line 49; please replace "oath" with --path--

Signed and Sealed this

Tenth Day of November, 2009

David J. Kappos
*Director of the United States Patent and Trademark Office*